(12) United States Patent
Chen

(10) Patent No.: US 11,397,243 B2
(45) Date of Patent: *Jul. 26, 2022

(54) PROXIMITY SENSOR INCLUDING ENCLOSED ACCOMMODATION SPACE WITH SEALED LIGHT PASSAGE AND MANUFACTURING METHOD THEREOF

(71) Applicant: PixArt Imaging Incorporation, Hsin-Chu (TW)

(72) Inventor: Nientse Chen, Hsin-Chu (TW)

(73) Assignee: PIXART IMAGING INCORPORATION, Hsin-Chu (TW)

( * ) Notice: Subject to any disclaimer, the term of this patent is extended or adjusted under 35 U.S.C. 154(b) by 0 days.

This patent is subject to a terminal disclaimer.

(21) Appl. No.: 17/188,610

(22) Filed: Mar. 1, 2021

(65) Prior Publication Data
US 2021/0208252 A1    Jul. 8, 2021

Related U.S. Application Data

(60) Continuation of application No. 16/829,261, filed on Mar. 25, 2020, now Pat. No. 10,969,472, which is a continuation of application No. 16/247,503, filed on Jan. 14, 2019, now Pat. No. 10,634,768, which is a division of application No. 15/226,599, filed on Aug. 2, 2016, now Pat. No. 10,222,457, which is a continuation of application No. 14/061,709, filed on Oct. 23, 2013, now Pat. No. 9,435,886.

(30) Foreign Application Priority Data

Nov. 14, 2012 (TW) .................... 101142329

(51) Int. Cl.
*G01S 7/481* (2006.01)
*G01S 17/04* (2020.01)

(52) U.S. Cl.
CPC .......... G01S 7/4813 (2013.01); G01S 7/4811 (2013.01); G01S 17/04 (2020.01); *H01L 2224/48091* (2013.01); *H01L 2924/16153* (2013.01); *Y10T 29/49016* (2015.01)

(58) Field of Classification Search
CPC ...... G01S 7/4811; G01S 7/4813; G01S 17/04; G01S 17/06; G01S 17/86; H01L 2924/16153; H01L 2924/181
USPC ..................... 250/239, 221, 214.1
See application file for complete search history.

(56) References Cited

U.S. PATENT DOCUMENTS 10,416,287 B2 * 9/2019 Masuda ............... G01S 7/4817

* cited by examiner

*Primary Examiner* — Que Tan Le
(74) *Attorney, Agent, or Firm* — Tung & Associates

(57) ABSTRACT

A proximity sensor includes: a transmitter unit for transmitting a light signal; a receiver unit for receiving the light signal reflected by an object to determine a proximity status of the object; and a housing defining a first enclosed accommodation space for accommodating the receiver unit, wherein the portion of the housing which defines the first enclosed accommodation space has a sealed light passage made of a light-transmissible material such that the receiver unit is capable of receiving the light signal reflected by the object through the light passage. The housing can further include a second enclosed accommodation space for accommodating the transmitter unit.

5 Claims, 6 Drawing Sheets

PROXIMITY SENSOR INCLUDING ENCLOSED ACCOMMODATION SPACE WITH SEALED LIGHT PASSAGE AND MANUFACTURING METHOD THEREOF

CROSS REFERENCE

The present invention claims priority to TW 101142329, filed on Nov. 14, 2012.

BACKGROUND OF THE INVENTION

Field of Invention

The present invention relates to a proximity sensor, especially a proximity sensor including an enclosed accommodation space, and a manufacturing method thereof.

Description of Related Art

Various kinds of input/control devices for electronic product have been developed such as touch screen, gravity sensor, etc. The proximity sensor is one of such input/control devices and widely used in various new devices. As one application example, the proximity sensor can be used for shutting down the screen display of a cellular phone to save power when it is detected that a user's face is close to the cellular phone, which implies that the user is talking through the cellular phone. The proximity sensor senses an action of the user or a change of the electronic product, and such information can be used by the system to generate a corresponding command.

FIG. 1 shows a prior art proximity sensor 10, wherein a transmitter unit 11 transmits a light signal L which is reflected by an object and the reflected light signal L is received by a receiver unit 12; the receiver unit 12 can determine the proximity status of the object according to the received light signal L such as by its intensity. The prior art proximity sensor 10 includes openings 13 and 14 as paths for the light signal L. However, due to miniature requirement, to reduce the size of the product, the protection structure for the sensor is simplified or even removed, so dirt can fall inside the product to interfere the sensing capability and cause misjudgment or even failure to transmit or receive signals. Therefore, it is desired to protect the transmitter unit 11 and the receiver unit 12 from dirt by a simple structure.

SUMMARY OF THE INVENTION

The present invention provides a proximity sensor, especially a proximity sensor including an enclosed accommodation space.

In one aspect, the present invention provides a proximity sensor which includes a transmitter unit for transmitting a light signal; a receiver unit for receiving the light signal reflected by an object to determine a proximity status of the object; and a housing having at least a portion which defines an enclosed receiver accommodation space for accommodating the receiver unit, wherein the portion of the housing defining the enclosed receiver accommodation space includes a sealed first light passage made of a first light-transmissible material, the first light passage being provided for the light signal reflected by the object to pass through.

In a preferable embodiment of the present invention, the housing has at least another portion which defines an enclosed transmitter accommodation for accommodating the transmitter unit, wherein the another portion of the housing defining the enclosed transmitter accommodation space includes a sealed second light passage made of a second light-transmissible material, the second light passage being provided for the light signal transmitted from the transmitter unit to pass through, wherein the second light-transmissible material is the same as or different from the first light-transmissible material.

In a preferable embodiment of the present invention, the housing further includes another portion made of light shielding material.

In another preferable embodiment of the present invention, the housing includes a portion made of the light-transmissible material whose surface is partially covered by a light shielding material such that the uncovered light-transmissible material forms the first light passage and/or the second light passage.

In a preferable embodiment of the present invention, the housing includes a top cover and at least one partition wall. When the housing includes a portion made of the light-transmissible material whose surface is partially covered by the light shielding material, the light shielding material includes a top shielding layer adhered to the top surface or bottom surface of the top cover, and a side shielding layer adhered to one side or both sides of the partition wall. In one embodiment of the present invention, a light extinction structure can be disposed between the top shielding layer and the side shielding layer.

In another aspect, the present invention also provides a manufacturing method of a proximity sensor, wherein the proximity sensor includes a substrate, a transmitter unit on the substrate for transmitting a light signal, and a receiver unit on the substrate for receiving the light signal reflected by an object to determine a proximity status of the object, the manufacturing method comprising: providing a substrate, to dispose the transmitter unit and the receiver unit thereon; connecting a housing to the substrate, to form at least one enclosed accommodation space for accommodating the receiver unit; and forming a light passage made of a light-transmissible material on the housing for the receiver unit to receive the light signal from outside of the enclosed accommodation space.

In one embodiment of the manufacturing method of the proximity sensor, the housing further includes a portion made of a light shielding material. In another embodiment, the housing includes a portion made of the light-transmissible material whose surface is partially covered by the light shielding material such that the uncovered light-transmissible material forms the light passage. Besides the enclosed accommodation space for accommodating the receiver unit, the housing can also define another enclosed accommodation space for accommodating the transmitter unit. The housing having the enclosed accommodation space for accommodating the transmitter unit preferably includes a light passage.

The objectives, technical details, features, and effects of the present invention will be better understood with regard to the detailed description of the embodiments below, with reference to the drawings.

DESCRIPTION OF THE PREFERRED EMBODIMENTS

The drawings as referred to throughout the description of the present invention are for illustrative purpose only, but not drawn according to actual scale. The orientation wordings in the description such as: above, under, left, or right are for reference with respect to the drawings, but not for limiting the actual product made according to the present invention.

Figure 1:
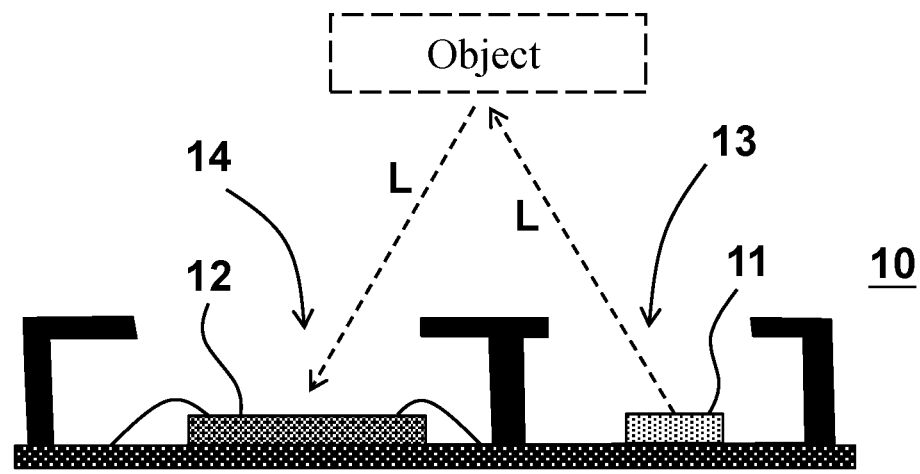
FIG. 1 shows a prior art proximity sensor.
Figure 2:
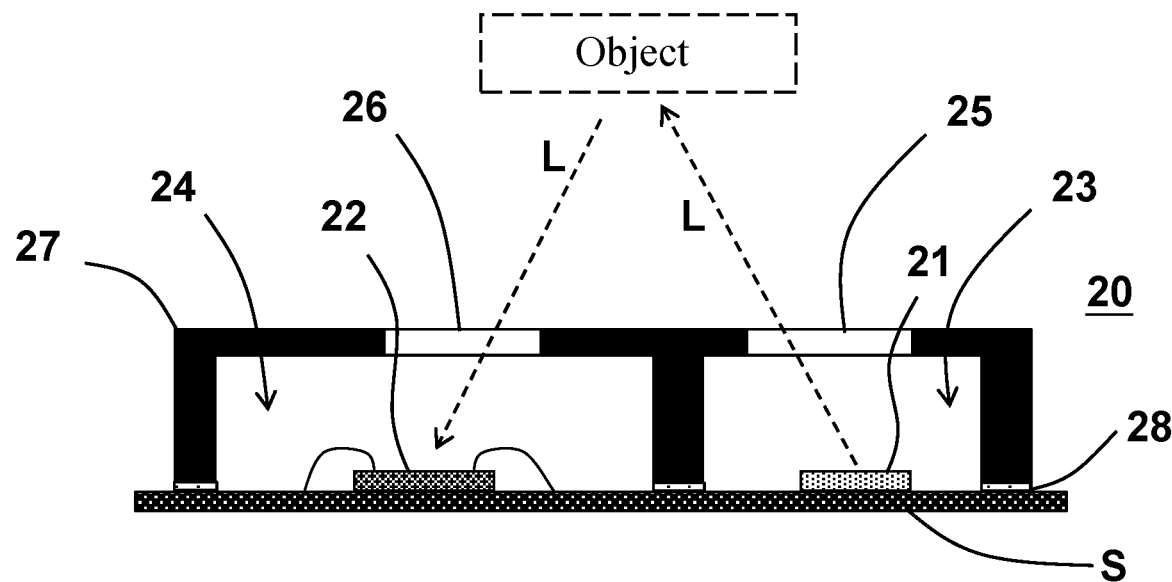
FIG. 2 shows a first preferable embodiment of the proximity sensor according to the present invention.
Figure 3:
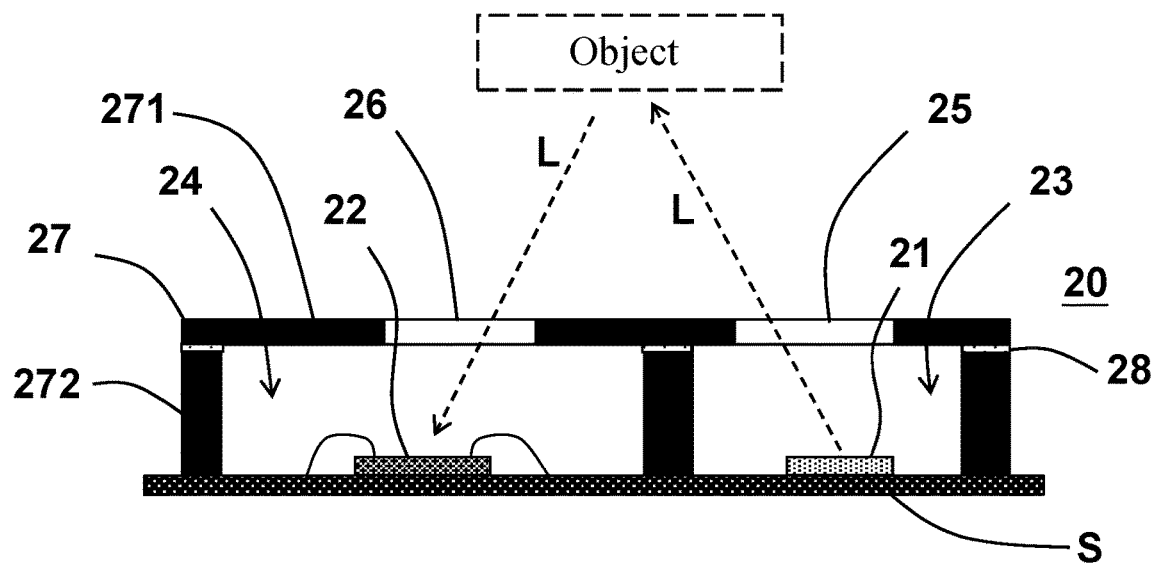
FIG. 3 shows a second preferable embodiment of the proximity sensor according to the present invention.

FIG. 2 shows an embodiment of a proximity sensor 20 according to the present invention. The proximity sensor includes a transmitter unit 21 and a receiver unit 22 on a substrate S; the transmitter unit 21 transmits alight signal L, and the receiver unit 22 receives the light signal L reflected by an object to determine a proximity status of the object. The proximity sensor 20 preferably includes an enclosed transmitter accommodation space 23 and an enclosed receiver accommodation space 24. The enclosed transmitter accommodation space 23 is provided on the substrate S and its size is larger than the transmitter unit 21 disposed inside the enclosed transmitter accommodation space 23. The light signal L transmitted by the transmitter unit 21 can be projected on the object through a light passage 25. The enclosed receiver accommodation space 24 is also provided on the substrate S and its size is larger than the receiver unit 22 disposed inside the enclosed receiver accommodation space 24. The receiver unit 22 can receive the light signal L reflected by the object through a light passage 26. In one embodiment, the enclosed transmitter accommodation space 23 and the enclosed receiver accommodation space 24 are respectively defined by portions of the housing 27. In the embodiment shown in the figure, the enclosed transmitter accommodation space 23 and the enclosed receiver accommodation space 24 do not directly communicate with each other (that is, the partition wall between the two spaces seals them from each other). However, the present invention is not limited to this arrangement, and can be arranged otherwise. For example, the housing 27 can include a top cover 271 and partition walls 272 connected together (as shown in FIG. 3), wherein the connection between the top cover 271 and the partition walls 272 may include a clearance due to manufacture or assembly reasons such that the enclosed transmitter accommodation space 23 and the enclosed receiver accommodation space 24 can communicate with each other through this clearance. In this case, it is fine as long as there is not too much light passing from the enclosed transmitter accommodation space 23 to the enclosed receiver accommodation space 24 through the clearance to interfere with the reading by the receiver unit 22.

Referring to FIG. 2, the housing 27 can be made of a light shielding material, or made of any material and covered by a light shielding material on its surface. The light passage 25 and the light passage 26 are sealed and made of the same or different light-transmissible materials, which can be assembled by any method to become integrated with the housing 27 (a detailed example will be described later); the purpose of such arrangement is to prevent dirt from entering the enclosed transmitter accommodation space 23 and the enclosed receiver accommodation space 24 and provide guided paths of the light signal L such that the proximity status of the object can be better detected. When the distance between the object and the proximity sensor is shorter, the receiver unit 22 will receive a stronger light signal L, and when the distance between the object and the proximity sensor is longer, the receiver unit 22 will receive a weaker light signal L, so that the proximity status of the object can be determined.

Referring to FIG. 2, the enclosed transmitter accommodation space 23 is formed by the substrate S, the light passage 25, and the housing 27; the enclosed receiver accommodation space 24 is formed by the substrate S, the light passage 26, and the housing 27 (the light passages 25 and 26 can be regarded as portions of the housing 27). The housing 27 and the substrate S can be connected by any means such as adhesion (for example as shown by the adhesion area 28 in FIG. 2), bolt connection, hot melting connection, engaging connection, locking connection, latch connection, halved connection, pivot connection, welding connection, etc., as long as the purpose to protect the transmitter unit 21 and the receiver unit 22 from dirt and to insulate the enclosed transmitter accommodation space 23 and the enclosed receiver accommodation space 24 from unnecessary light interference is achieved.

FIG. 3 shows another preferable embodiment of the present invention. This embodiment is similar to the embodiment of FIG. 2 in that the proximity sensor 20 accommodates the transmitter unit 21 and the receiver unit 22 respectively in the enclosed transmitter accommodation space 23 and the enclosed receiver accommodation space 24. However, this embodiment is different from the embodiment of FIG. 2 in that the housing 27 is an assembly of a top cover 271 and several partition walls 272 (the partition walls 272 include the one surrounding the outer periphery and the one between the two enclosed accommodation spaces). In a different embodiment, the housing can be made in one piece (that is, the top cover 271 and the partition walls 272 are not separated pieces), for example by plastic injection molding, die casting, metal forging, etc.; however, to manufacture the housing 27 by such methods usually has residual stress or deformation problems. These problems can be improved by respectively manufacturing the top cover 271 and the partition walls 272 and then assembling them together. The connection between the top cover 271 and the partition walls 272 can be done for example by adhesion (for example as shown by the adhesion area in FIG. 3), bolt connection, hot melting connection, engaging connection, locking connection, latch connection, halved connection, pivot connection, welding connection, etc.

Figure 4:
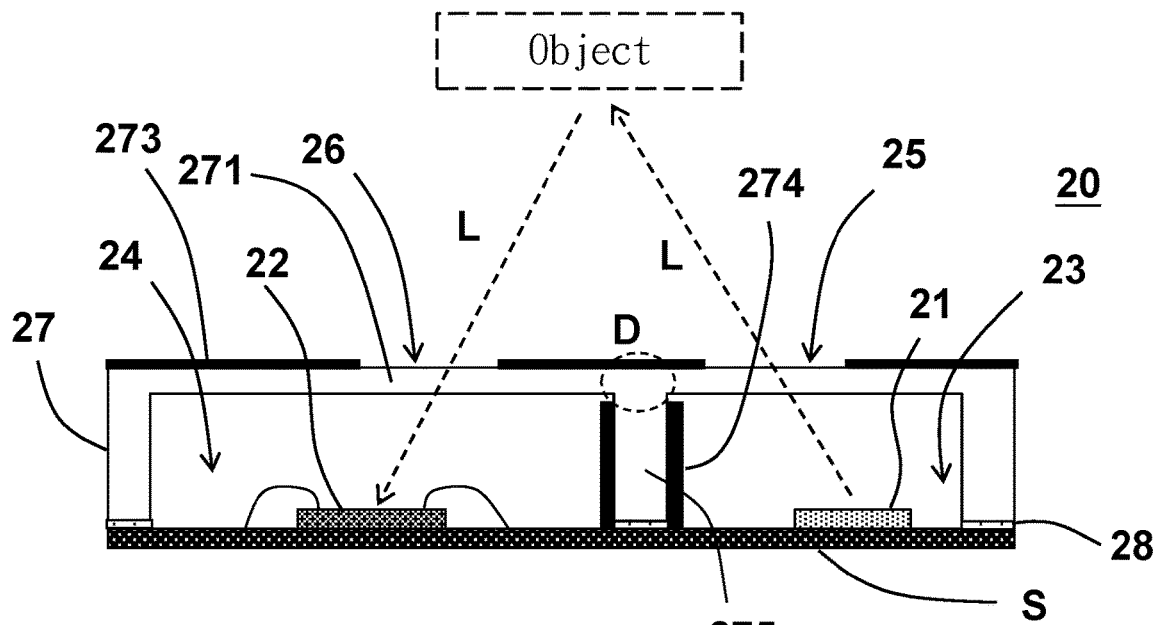
FIG. 4 shows a third preferable embodiment of the proximity sensor according to the present invention.

FIG. 4 shows another preferable embodiment of the present invention. This embodiment is similar to the embodiment of FIG. 2 in that: the proximity sensor 20 includes the enclosed transmitter accommodation space 23 and the enclosed receiver accommodation space 24 which respectively accommodate the transmitter unit 21 and the receiver unit 22 disposed therein. However, this embodiment is different from the embodiment of FIG. 2 in that the housing 27 is made of light-transmissible material and covered by a light shielding material; the areas of the light transmissible material which are not covered by the light shielding material form the light passages 25 and 26. More specifically, the light shielding material can be regarded as including one or multiple top shielding layers 273 (which are not connected from the cross-section view of FIG. 4, but can be connected or not connected from top view), and at least one side shielding layer 274, wherein the top shielding layer 273 is adhered to the top cover 271, and the side shielding layer 274 is adhered to one or two sides of the partition wall 274 (referred to as inner wall 275 hereafter) between the enclosed transmitter accommodation space 23 and the enclosed receiver accommodation space 24. The top shielding layer 273 includes at least one opening to form the light passage 25 and/or the light passage 26 (the light passage 25 and the light passage 26 can be connected or not connected from top view). The side shielding layer 274 provides light shielding function between the enclosed transmitter accommodation space 23 and the enclosed receiver accommodation space 24 to prevent light from passing directly through the inner wall 275 into the receiver unit 22 without reflection by the object; this could interfere the reading by the receiver unit 22. The top shielding layer 273 shown in FIG. 4 is provided on the top surface of the housing 27; however, the present invention is not limited to this embodiment and the light shielding layer 273 can be provided on the bottom surface or both the top and bottom surfaces of the housing 27. The side shielding layers 274 shown in FIG. 4 are provided on both sides of the inner wall 275; however, the present invention is not limited to this embodiment and the side shielding layer 274 can be provided on only one side of the inner wall 274. The top shielding layer 273 and the side shielding layer 274 can be connected or not connected. When the top shielding layer 273 and the side shielding layer 274 are not connected, some stray light might pass through the gap at the unconnected location, but this is fine as long as the stray light does not interfere the reading by the receiver unit 22. In one preferable embodiment, for reducing such stray light, a light extinction structure can be disposed between the top shielding layer 273 and the side shielding layer 274 (such as at the location marked D in FIG. 4). The light extinction structure for example can be formed by increasing the surface roughness, embedding a light shielding material, stuffing a light shielding material (such as forming the inner wall 275 by dual injection). The top shielding layer 273 and the side shielding layer 274 can be formed by masked painting, printing, masked electro-plating, adhesion, etc., which can be determined as desired.

Figure 5:
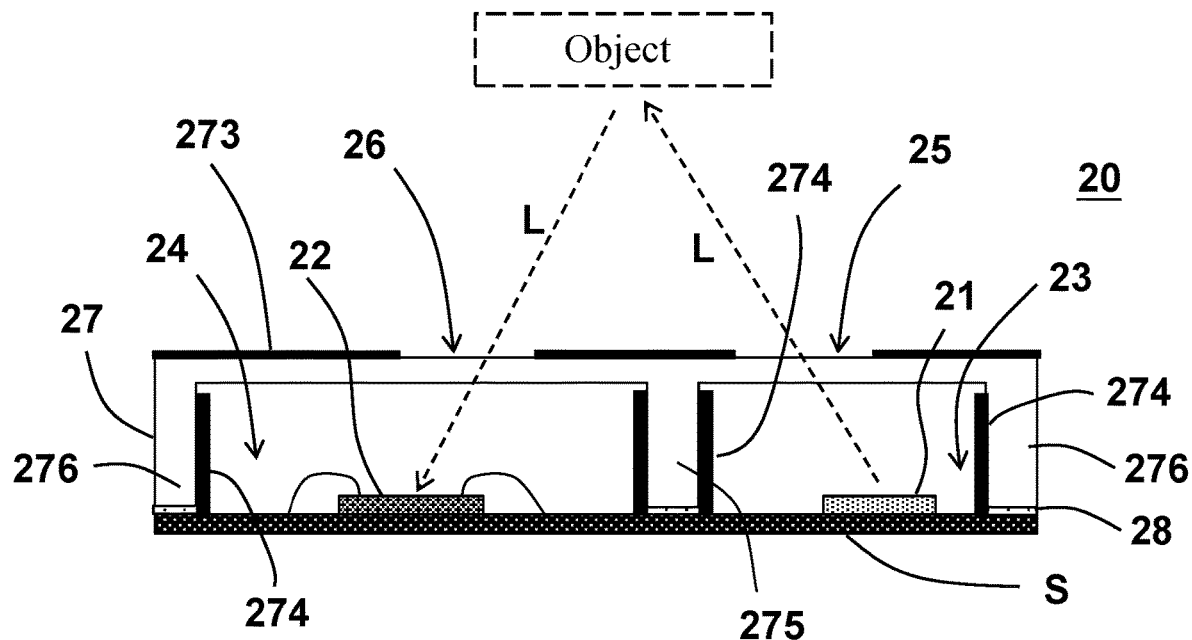
FIG. 5 shows a fourth preferable embodiment of the proximity sensor according to the present invention.

FIG. 5 shows another preferable embodiment of the present invention. This embodiment is similar to the embodiment of FIG. 4 in that the proximity sensor 20 includes a light transmissible housing 27 which, together with the substrate S, form the enclosed transmitter accommodation space 23 and the enclosed receiver accommodation space 24 for respectively accommodating the transmitter unit 21 and the receiver unit 22. The difference is that the side shielding layers 274 are adhered not only onto the sides of the inner wall 275 between the transmitter unit 21 and the receiver unit 22 but also onto one or both sides of the outer partition walls 272 (referred to as outer walls 276 hereafter), to better block ambient light. In the shown embodiment only one side of the outer wall 276 is provided with the side shielding layer 274, but the present invention is not limited to this and both sides of the outer wall 276 can be provided with the side shielding layers 274.

Figure 6:
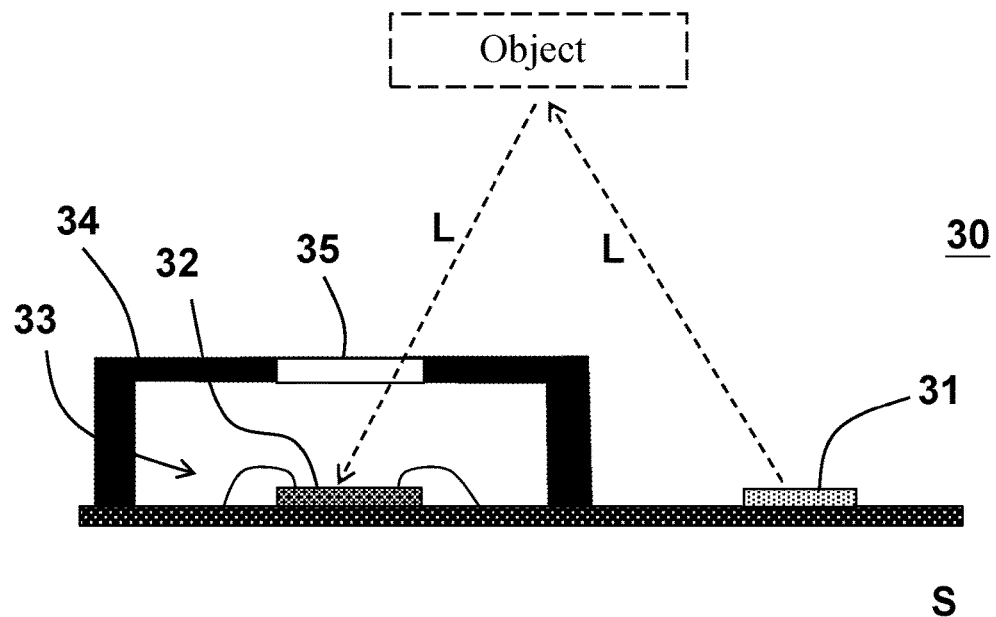
FIG. 6 shows a fifth preferable embodiment of the proximity sensor according to the present invention.

FIG. 6 shows another preferable embodiment of the present invention, wherein the proximity sensor 30 includes a transmitter unit 31 and a receiver unit 32 on the substrate S to transmit and receive a light signal L on and reflected from an object, and determines the proximity status of the object according to the received light signal L. The proximity sensor further includes an enclosed accommodation space 33 connected to the substrate S, and the enclosed accommodation space 33 has a size which is larger than the receiver unit 32 accommodated therein; the receiver unit 32 can receive the light signal L reflected by the object through a light passage 35. Compared to FIGS. 2, 3, 4, and 5, the embodiment shown in the FIG. 6 is simpler. Because the proximity sensor 30 determines the proximity status of the object according to the received light signal L reflected from the object, it is preferred that the receiver unit 32 is enclosed in an accommodation space (i.e. 33) for protection and for avoiding stary light interference. The transmitter unit 31 can be disposed in an open space because it does that affect the reading. The enclosed accommodation space 33 is formed by the substrate S, a housing 34, and a light passage 35 embedded in the housing 34. The housing 34 can be made of a light shielding material, or adhered by a light shielding material, as referring to the aforementioned embodiments.

Figure 7:
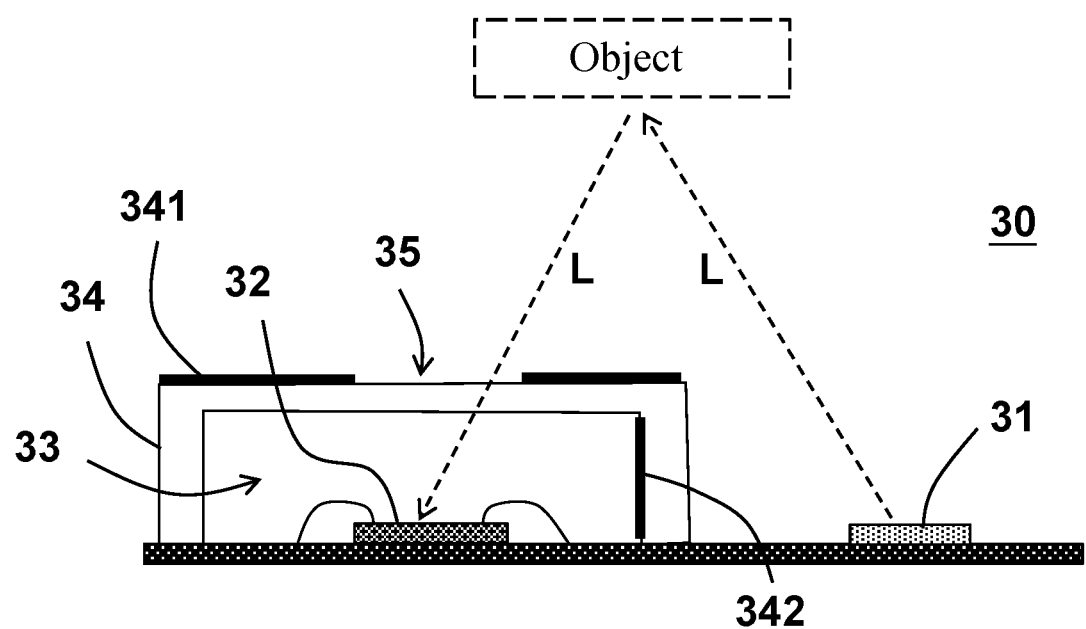
FIG. 7 shows a sixth preferable embodiment of the proximity sensor according to the present invention.

FIG. 7 shows another preferable embodiment of the present invention. The proximity sensor 30 includes a transmitter unit 31 and a receiver unit 32 on the substrate S to transmit a light signal L onto an object and to receive the light signal L reflected by the object, and determines the proximity status of the object according to received light signal. This embodiment is similar to the embodiment of FIG. 6 in that an enclosed accommodation space 33 is provided on the substrate S, and the enclosed accommodation space 33 has a size which is larger than the receiver unit 32 accommodated therein. The receiver unit 32 can receive the light signal L reflected by the object through a light passage 35. However, this embodiment is different from the embodiment of FIG. 6 in that that the housing 34 is made of a light transmissible material and a light shielding material is adhered onto light transmissible material, wherein the light shielding material partially covers the light transmissible material. In detail, the light shielding material can be regarded as including a top shielding layer 341 and a side shielding layer 342. The top shielding layer 341 includes an opening to form the light passage 35, and the side shielding layer 342 is adhered on the side wall of the housing 34 between the transmitter unit 31 and the receiver unit 32, to provide light shielding function for the enclosed accommodation space 33. Optionally, a light extinction structure can be provided between the top shielding layer 341 and the side shielding layer 342, and the light extinction structure for example can be: increasing the surface roughness, embedding a light shielding material, stuffing a light shielding material (for example, by dual injection), etc.

Figure 8A:
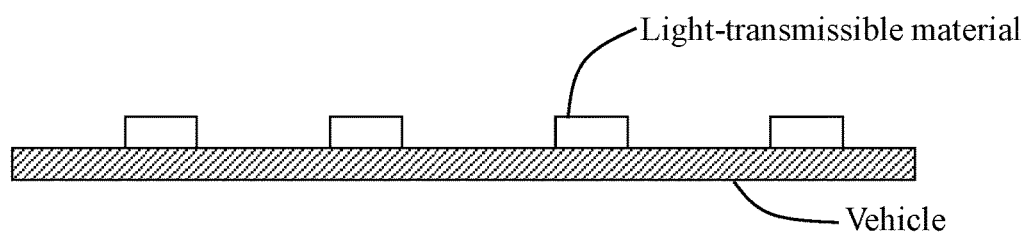
FIGS. 8A, 8B, 8C and 8D show a preferable embodiment of the present invention for forming the top cover with the light passage embedded in the top cover.
Figure 8B:
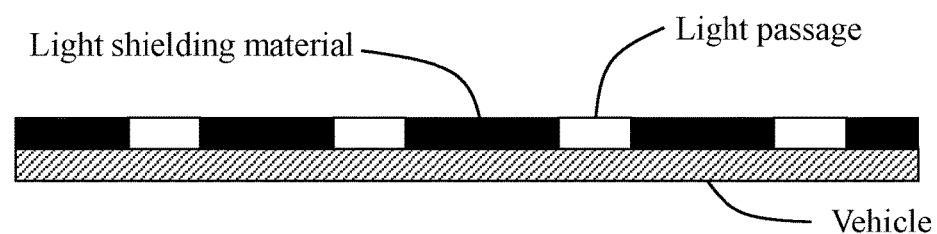
Figure 8C:
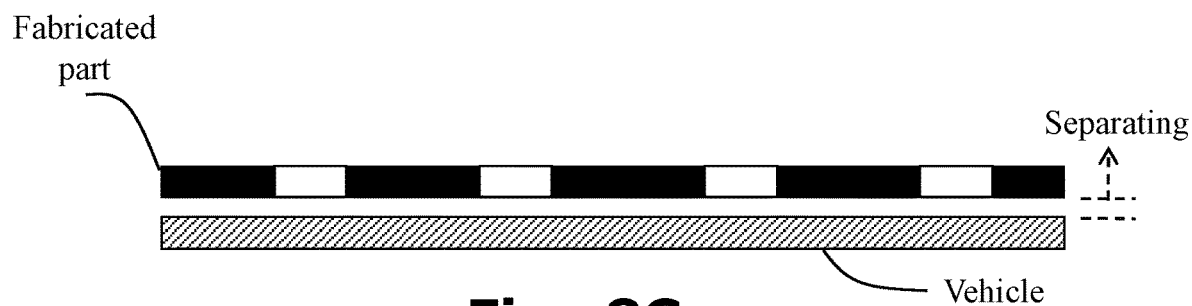
Figure 8D:
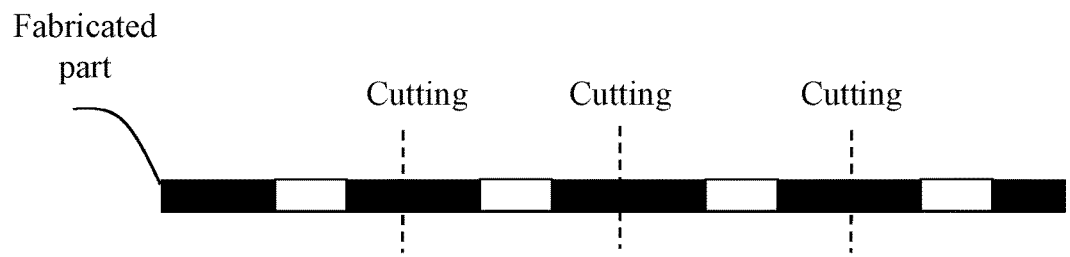

In more detail, the passage in the housing shown in FIGS. 2, 3 and 6 can be formed for example by adhesion, hot melting connection, engaging connection, etc.; in one illustrative example, the passage and the housing (or top cover) can be made as one fabricated part (one integrated piece), an this example will be explained with reference to FIGS. 8A, 8B, 8C and 8D. In FIG. 8A, a vehicle is provided and at least one light transmissible object is put on it, wherein the at least one light transmissible object is made of a light transmissible material. Referring to FIG. 8B, a light shielding material is coated or deposited on the vehicle to surround the at least one light transmissible object; next, the light shielding material is solidified so that the light shielding material and the at least one light transmissible object are fixed together to forma fabricated part. Referring to 8C, the fabricated part is separated from the vehicle. Referring to FIG. 8D, the fabricated part are cut into pieces to form one or more top covers.

The present invention also provides a manufacturing method of a proximity sensor, wherein the proximity sensor includes a substrate, a transmitter unit on the substrate for transmitting a light signal, and a receiver unit on the substrate for receiving the light signal reflected by an object to determine a proximity status of the object. The manufacturing method includes: providing a substrate, to accommodate the transmitter unit and the receiver unit thereon; connecting a housing to the substrate, to form at least one enclosed accommodation space for accommodating the receiver unit; and forming a light passage made of a light-transmissible material on the housing for the receiver unit to receive the light signal from outside of the enclosed accommodation space.

In one embodiment of the aforementioned manufacturing method of the proximity sensor, the housing includes a portion made of a light shielding material and the light passage made of the light-transmissible material. Or in another embodiment, the housing includes a portion made of the light-transmissible material whose surface is partially covered by the light shielding material, and the uncovered light-transmissible material forms the light passage. The housing can define two enclosed accommodation spaces for respectively accommodating the transmitter unit and the receiver unit. The enclosed accommodation space for accommodating the transmitter unit can have a light passage.

According to the above, the present invention provides a proximity sensor 20 or 30, which includes the aforementioned substrate S, the aforementioned transmitter unit 21 or 31, the aforementioned receiver unit 22 or 32 and an enclosing housing such as the aforementioned housing 27), as shown in embodiments of FIGS. 2-7. Referring to FIGS. 2-7, the transmitter unit 21 or 31 is disposed on the substrate s and can transmit a light (such as the aforementioned light signal L). The receiver units 22 or 32 is disposed on the substrate S and can receive the light reflected by an object when the object is close to the proximity sensor 20 or 30. The housing is disposed on the substrate S to define a first enclosed accommodation space (such as the aforementioned enclosed receiver accommodation space 24) for accommodating the receiver unit 22 or 32. The housing includes a light passage 26 made of the light transmissible material, wherein the receiver unit 22 or 32 can receive the light reflected by the object through the light passage 26 when the object is close to the proximity sensor 20 or 30.

Still referring to FIGS. 2-7, the enclosing housing can further include a second enclosed accommodation space (such as the aforementioned enclosed transmitter unit 23) for accommodating the transmitter unit 21 or 31, and the enclosing housing includes a second light passage 25 made of another or the same light-transmissible material, wherein the transmitter unit 21 or 31 can transmit the light to the object through the second light passage 25 when the object is close to the proximity sensor 20 or 30. The first enclosed accommodation space and the second enclosed accommodation space preferably do not directly communicate with each other.

Figure 9:
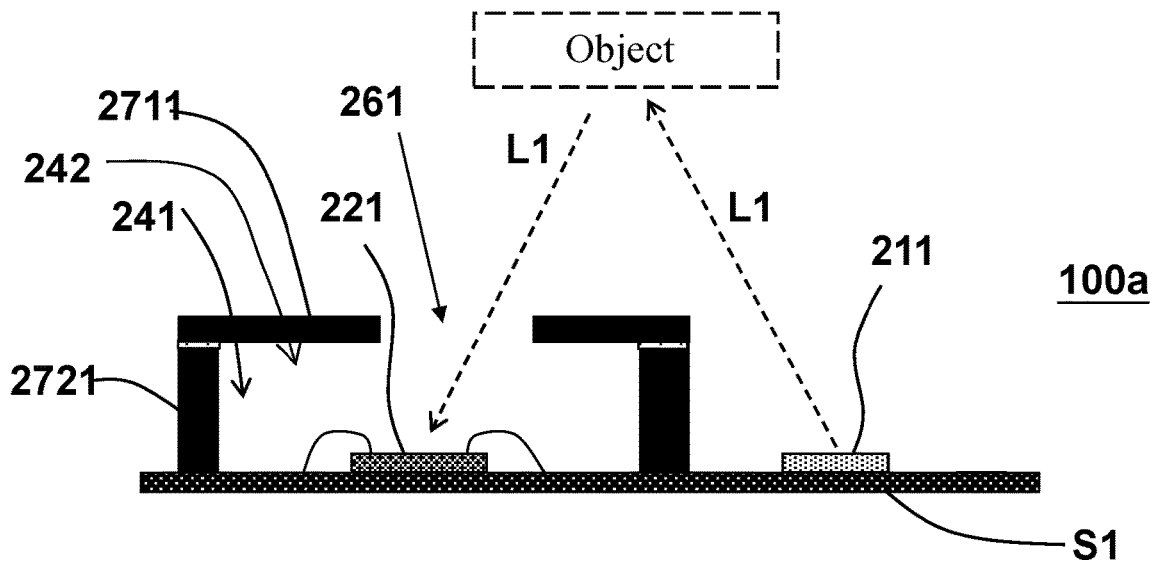
FIG. 9 shows another preferable embodiment of the proximity sensor according to the present invention.

FIG. 9 shows another preferable embodiment of the present invention. The proximity sensor 100a includes a substrate S1, a transmitter unit 211, a receiver unit 221, a housing 2721, and a cover 2711. The transmitter unit 211 is disposed on the substrate S1 and is capable of transmitting light L1. The receiver unit 211 is disposed on the substrate S1 and is capable of receiving the light L1 reflected by an object when the object is close to the proximity sensor 100a. In this embodiment, the substrate S1, the transmitter unit 211, the receiver unit 221 for example can adopt, but are not limited to, the structure as described in the aforementioned embodiments.

In detail, the housing 2721 is disposed on the substrate S1 to define a first accommodation space 241 for accommodating the receiver unit 221 and an opening 242 for exposing the first accommodation space 241, wherein the opening 242 can be located at a side of the first accommodation space 241 and it completely exposes that side of first accommodation space 241 (such as the top side as shown in FIG. 9). Although the opening does not block dirt, in comparison with the housing of the prior art proximity sensor 10, the housing 2721 of this embodiment is simpler and easier for manufacture. Besides, in order to block stray light so as to improve the optical performance of the proximity sensor, the cover 2711 can be disposed on the housing 2721 and it includes an opening 261 for exposing the first accommodation space 241, wherein the area of the opening 261 is smaller than the opening 242 of the housing 2721, and the receiver unit 221 can receive the light L1 reflected by the object through the opening 261 when the object is close to the proximity sensor 100a. Furthermore, the cover 2711 can be connected to the housing 2711 by any means such as by adhesion. That is, the housing 2721 and the cover 2711 are individual parts assembled together, so that the manufacturing process is simpler and the cost is lower. In addition, because the housing and the cover are individual parts, either one or both of them can be easily replaced or adjusted, for example in maintenance or for different application environments, and therefore the structure provides more flexibility with lower cost.

Figure 10:
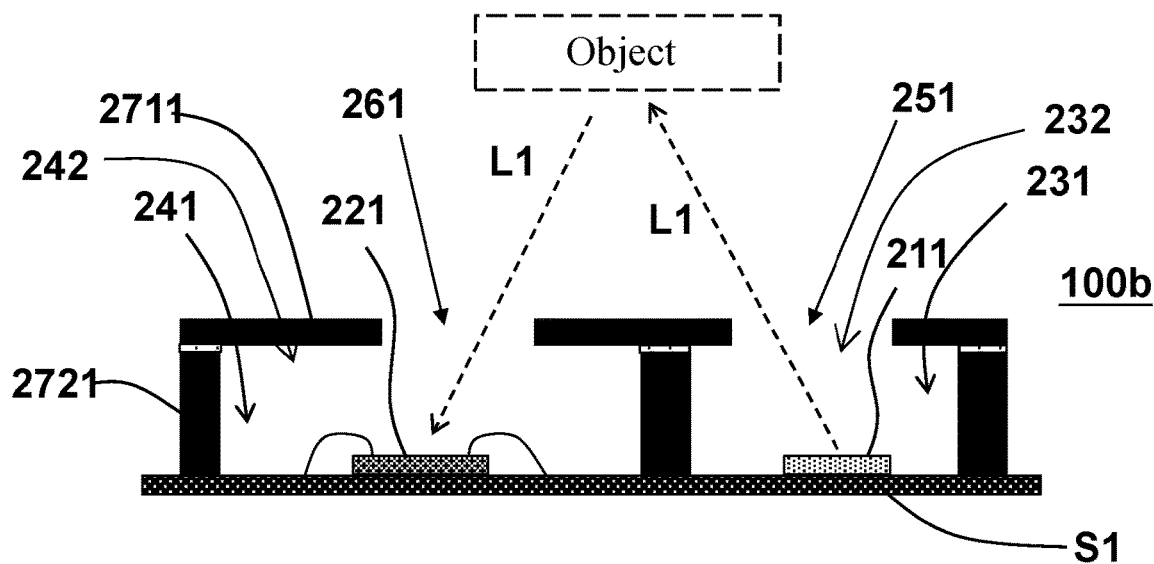
FIG. 10 shows another preferable embodiment of the proximity sensor according to the present invention.

FIG. 10 shows another preferable embodiment of the proximity sensor according to the present invention. This embodiment is similar to the embodiment of FIG. 9, with the difference that the housing 2721 further includes a second accommodation space 231 for accommodating the transmitter unit 211 and an opening 232 for exposing the second accommodation space 231, wherein the opening 232 completely exposes a side of the second accommodation space 231 (such as the top side as shown in FIG. 10). To improve the optical performance of the proximity sensor 100b, the cover 2711 can include an opening 251 which exposes the second accommodation space 231, wherein the area of the opening 251 of the cover 2711 is smaller than the opening 232 of the housing 2721.

Similarly, the cover 2711 can be connected to the housing 2711 by any means such as by adhesion. That is, the housing 2721 and the cover 2711 are individual parts assembled together, so that the manufacturing process is simpler and the cost is lower. In addition, because the housing and the cover are individual parts, either one or both of them can be easily replaced or adjusted, for example in maintenance or for different application environments, and therefore the structure provides more flexibility with lower cost.

The present invention has been described in considerable detail with reference to certain preferred embodiments thereof. It should be understood that the description is for illustrative purpose, not for limiting the scope of the present invention. Those skilled in this art can readily conceive variations and modifications within the spirit of the present invention. For example, the aforementioned embodiments can be implemented in combination. As one example, the housing can be partially made of a light shielding material and partially made of a light-transmissible material which is partially covered by a light shielding material. For a more specific example, the top cover can be made of a light-transmissible material covered with a light shielding material, and the partition wall can be made of a light shielding material, or the partition wall can be made of a light-transmissible material covered with a light shielding material, and the top cover can be made of a light shielding material. For another example, the cover and the partition wall of the housing are not necessarily two distinctly different parts with a clear boundary; as an example, the boundary between the cover and the partition wall may have an arc shape. Therefore, as long as the housing includes a top covering function and a side partitioning function, the housing can be regarded as including a cover and a partition wall.

Further, the term "seal" as used in this specification includes but is not limited to such a condition that the sealed light passage is completely air-tight or the sealed light passage absolutely does not include any micro-holes, micro-gaps or micro-seams. It is within the scope of the present invention that the sealed light passage has or does not have such micro-holes, micro-gaps or micro-seams, as long as the sealing effect can block at least majority of the dirt.

Therefore, the scope of the present invention should cover all such modifications. Besides, an embodiment or a claim of the present invention does not need to attain or include all the objectives, advantages or features described in the above. The abstract and the title are provided for assisting searches and not to be read as limitations to the scope of the present invention.

What is claimed is:

1. An optical sensor, comprising:
a transmitter unit, for transmitting a light signal;
a receiver unit, for receiving the light signal reflected by an object to determine a status of the object; and
a housing having at least a portion which defines an enclosed receiver accommodation space for accommodating the receiver unit, wherein the portion of the housing defining the enclosed receiver accommodation space includes a sealed light passage made of a light-transmissible material and a light shielding material surrounding the light-transmissible material, the light passage being provided for the light signal reflected by the object to pass through,
wherein the transmitter unit is located in an open space outside the housing.

2. The optical sensor of claim 1, wherein the housing includes a top cover and at least one partition wall.

3. A manufacturing method of an optical sensor, wherein the optical sensor includes a substrate, a transmitter unit on the substrate for transmitting a light signal, and a receiver unit on the substrate for receiving the light signal reflected by an object to determine a status of the object, the manufacturing method comprising:
providing a substrate, to accommodate the transmitter unit and the receiver unit thereon;
forming a housing which includes a light-transmissible material and a light shielding material surrounding the light-transmissible material so that a light passage through the housing is formed; and
connecting the housing to the substrate, to form at least one enclosed accommodation space for accommodating the receiver unit, wherein the transmitter unit is located in an open space outside the housing;
whereby the receiver unit receives the light signal from outside of the enclosed accommodation space.

4. The manufacturing method of claim 3, wherein the housing includes a top cover and at least one partition wall, and the light passage is located on the top cover.

5. The manufacturing method of claim 4, wherein the top cover is manufactured by steps including:
providing a vehicle, and disposing at least one light-transmissible object on the vehicle;
providing a light shielding material surrounding the at least one light-transmissible object on the vehicle; and
solidifying the light shielding material such that the light shielding material and the at least one light-transmissible object are fixed together to form a fabricated part;
separating the fabricated part from the vehicle; and
cutting the fabricated part into pieces to form at least one top cover.

* * * * *